(12) United States Patent
Fan

(10) Patent No.: US 11,263,955 B2
(45) Date of Patent: Mar. 1, 2022

(54) DISPLAY PANEL AND ELECTRONIC DEVICE

(71) Applicant: Shenzhen China Star Optoelectronics Semiconductor Display Technology Co., Ltd., Shenzhen (CN)

(72) Inventor: Yong Fan, Shenzhen (CN)

(73) Assignee: Shenzhen China Star Optoelectronics Semiconductor Display Technology Co., Ltd.

( * ) Notice: Subject to any disclaimer, the term of this patent is extended or adjusted under 35 U.S.C. 154(b) by 230 days.

(21) Appl. No.: 16/617,814

(22) PCT Filed: Nov. 5, 2019

(86) PCT No.: PCT/CN2019/115691
§ 371 (c)(1),
(2) Date: Nov. 27, 2019

(87) PCT Pub. No.: WO2020/232982
PCT Pub. Date: Nov. 26, 2020

(65) Prior Publication Data
US 2021/0327340 A1    Oct. 21, 2021

(30) Foreign Application Priority Data
May 22, 2019    (CN) .......................... 201910429166.8

(51) Int. Cl.
*G09G 3/32*        (2016.01)
*H01L 27/15*       (2006.01)
*H01L 33/60*       (2010.01)

(52) U.S. Cl.
CPC ............. *G09G 3/32* (2013.01); *H01L 27/156* (2013.01); *H01L 33/60* (2013.01); *G09G 2300/023* (2013.01); *G09G 2310/0278* (2013.01)

(58) Field of Classification Search
USPC ...... 345/82, 84, 103; 257/40, 88, 99; 438/29
See application file for complete search history.

(56) References Cited

U.S. PATENT DOCUMENTS 11,133,447 B2*  9/2021  Hsu .......................... H01L 33/20
2007/0132990 A1*  6/2007  Fukami ................ G01N 21/954
                                                         356/241.1
2007/0200131 A1*  8/2007  Kim ....................... H01L 33/486
                                                         257/99

(Continued)

FOREIGN PATENT DOCUMENTS

CN        102044554 A        5/2011
CN        106449657 A        2/2017
(Continued)

*Primary Examiner* — Thuy N Pardo
(74) *Attorney, Agent, or Firm* — Taft Stettinius & Hollister LLP

(57) ABSTRACT

A display panel and an electronic device are provided. The display panel includes a driving substrate, an insulating layer, which is provided with a first receiving groove and a second receiving groove, a first micro light emitting diode disposed in the first receiving groove, a second micro light emitting diode disposed in the second receiving groove, and a first reflective layer disposed above the second micro light emitting diode. The display panel and the electronic device can reduce a thickness of the display panel.

11 Claims, 2 Drawing Sheets

(56) References Cited

U.S. PATENT DOCUMENTS

| | | | |
|---|---|---|---|
| 2012/0282716 A1* | 11/2012 | Yonehara | B41J 2/45 |
| | | | 438/29 |
| 2012/0292646 A1* | 11/2012 | Nagai | H01L 27/156 |
| | | | 257/88 |
| 2015/0001495 A1 | 1/2015 | Choung et al. | |
| 2016/0204373 A1* | 7/2016 | Park | H01L 27/3246 |
| | | | 257/40 |
| 2018/0040822 A1* | 2/2018 | Lin | H01L 51/0024 |
| 2018/0294254 A1* | 10/2018 | Chen | G02B 19/0019 |
| 2018/0342691 A1* | 11/2018 | Lu | H01L 33/30 |
| 2019/0181295 A1* | 6/2019 | Lu | H01L 33/52 |
| 2020/0106045 A1* | 4/2020 | Han | H01L 27/3246 |
| 2020/0258866 A1* | 8/2020 | Wang | H01L 27/1222 |
| 2020/0266233 A1* | 8/2020 | Iguchi | H01L 33/06 |
| 2020/0274027 A1* | 8/2020 | Huang | H01L 33/644 |
| 2021/0257528 A1* | 8/2021 | Oh | H01L 33/64 |

FOREIGN PATENT DOCUMENTS

| | | |
|---|---|---|
| CN | 108183178 A | 6/2018 |
| CN | 108257949 A | 7/2018 |
| CN | 109256455 A | 1/2019 |
| CN | 109285858 A | 1/2019 |

\* cited by examiner

DISPLAY PANEL AND ELECTRONIC DEVICE

CROSS-REFERENCE TO RELATED APPLICATIONS

This application is a U.S. National Phase of International PCT Application No. PCT/CN2019/115691 filed Nov. 5, 2019, which claims the benefit of Chinese Patent Application Serial No. 201910429166.8 filed May 22, 2019, the contents of each application are incorporated herein by reference in their entirety.

FIELD OF INVENTION

The present disclosure relates to the field of display technologies, and more particularly to a display panel and an electronic device.

BACKGROUND OF INVENTION

Double-sided display panel mean that front and back sides are provided with a display screen, the front side thereof is a main panel, the back side thereof is a sub-panel, and the main panel is usually a full-screen design. When a front panel is lit, a back panel is turned off, and the back panel can be used as a back plate when the back panel is turned off, which reduces power consumption to a certain extent.

Current self-illuminating double-sided display panels typically include two display panels, and then backs of the two display panels are bonded together or combined. Although such a double-sided display panel can realize double-sided display, two display panels are required, a thickness thereof is large.

SUMMARY OF INVENTION

An object of the present disclosure provides a display panel and an electronic device capable of reducing a thickness of the display panel.

In order to solve the above technical problems, an embodiment of the present disclosure provides a display panel. The display panel includes a driving substrate, an insulating layer, which is provided with a first receiving groove and a second receiving groove, a first micro light emitting diode disposed in the first receiving groove, a second micro light emitting diode disposed in the second receiving groove, and a reflective layer disposed above the second micro light emitting diode.

An embodiment of the present disclosure further provides an electronic device including the above display panel.

Beneficial effects of an embodiment of the present disclosure are that, in the display panel and the electronic device of the embodiment of the present disclosure, because two micro light emitting diodes are disposed on a single display panel, and a first reflective layer is disposed above the second micro light emitting diode, light of the second micro light emitting diode is emitted toward a back surface of the display panel, thereby realizing a double-sided display, and because the two display panels are not required, an overall thickness of the display panel is reduced.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
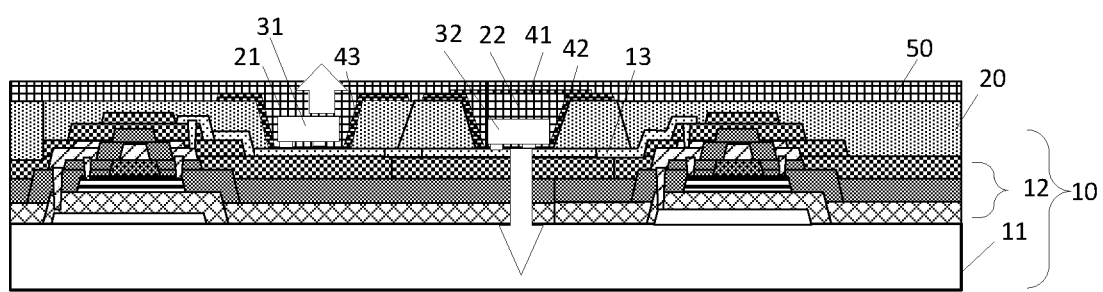
FIG. 1 is schematic structural view of a display panel according to an embodiment of the present disclosure.

The following description of the various embodiments is provided to illustrate the specific embodiments with reference to the accompanying drawings. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

Figure 2:
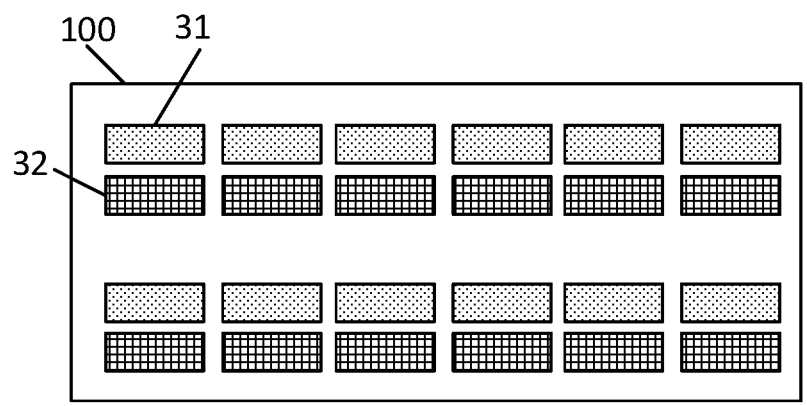
FIG. 2 is a top plan view of a display panel according to an embodiment of the present disclosure.

Referring to FIG. 1 and FIG. 2, a display panel 100 of an embodiment of the present disclosure is a double-sided display panel.

The display panel 100 of the embodiment of the present embodiment includes a driving substrate 10, an insulating layer 20, a first micro light emitting diode 31, and a second micro light emitting diode 32. The display panel 100 may further include a planarization layer 50.

A cross-sectional structure of the drive substrate 10 includes a base substrate 11, a switch array layer 12, and a pixel electrode 13.

The switch array layer 12 is disposed on the base substrate 11, which includes a plurality of thin film transistors.

The pixel electrode 13 is disposed on the switch array layer 12. Material of the pixel electrode 13 may include Indium tin oxide (ITO).

The insulating layer 20 is provided with a first receiving groove 21 and a second receiving groove 22. In an embodiment, in order to improve contrast, material of the insulating layer 20 is a light shielding material such as a black photoresist material.

The first micro light emitting diode 31 is disposed in the first receiving groove 21.

The second micro light emitting diode 32 is disposed in the second receiving groove 22, and a first reflective layer 41 is disposed above the second micro light emitting diode 32. The first reflective layer 41 covers the second receiving groove 22 in order to improve the display performance. That is, a projection area of the first reflective layer 41 on the base substrate 11 is greater than a projection area of the second receiving groove 22 on the base substrate 11.

The first micro light emitting diode 31 and the second micro light emitting diode 32 are adjacent to reduce a size of the display panel. In order to simplify a process, the pixel electrode 13 covers the first micro light emitting diode 31 and the second micro light emitting diode 32, and the first micro light emitting diode 31 and the second micro light emitting diode 32 are both electrically connected to the pixel electrode 13. That is to say, the two micro light emitting diodes share the pixel electrode, which can not only reduce a number of lines, but also make a current control more precise, thereby improving an accuracy of image color.

In an embodiment, a second reflective layer 42 is also disposed on a sidewall of the second receiving groove 22 in order to improve utilization of light.

In order to further improve utilization of light, in an embodiment, a third reflective layer 43 is also disposed on a sidewall of the first receiving groove 21. Materials of the first reflective layer, the second reflective layer, and the third reflective layer may be same. In one embodiment, the first reflective layer 41, the second reflective layer 42, and the third reflective layer 43 are fabricated in a same process.

Figure 3:
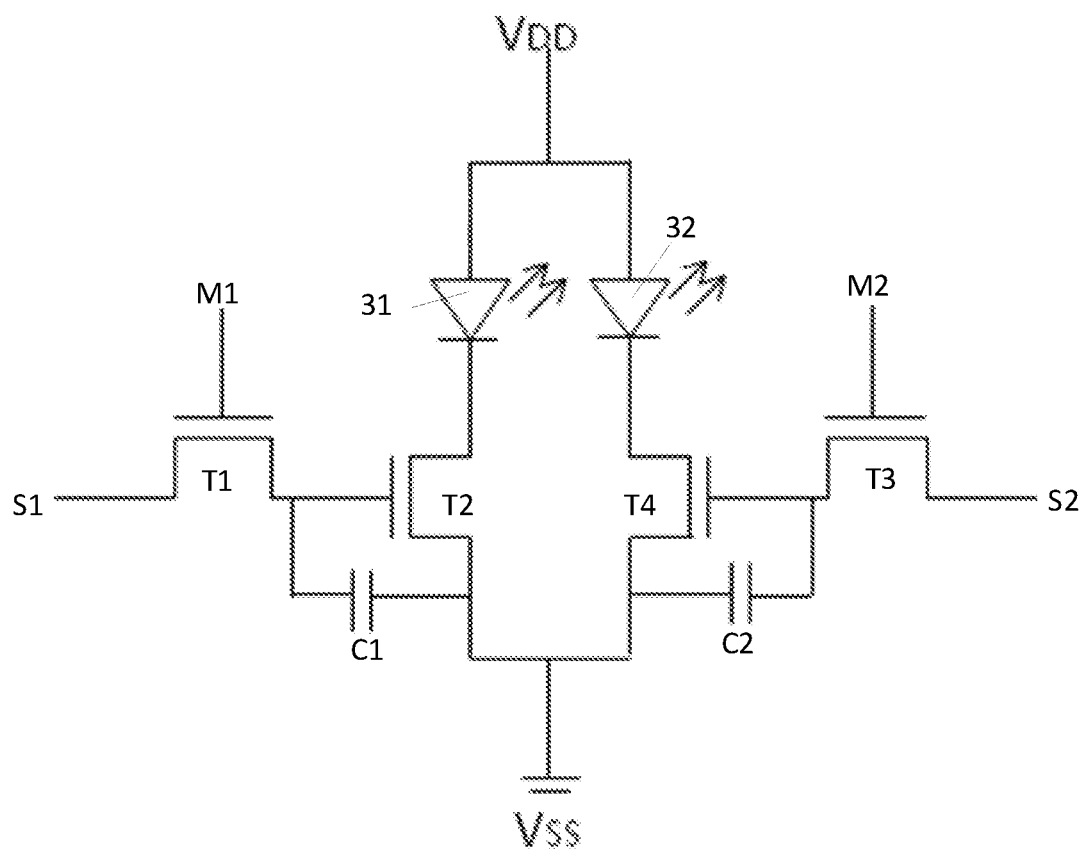
FIG. 3 is a circuit diagram of a display unit according to an embodiment of the present disclosure.

Referring to FIG. 3, the driving substrate 10 further includes a first thin film transistor T1 and a second thin film transistor T2. A gate of the first thin film transistor T1 is connected to a first scan signal S1, a source of the first thin film transistor T1 is connected to a first data signal M1, a drain of the first thin film transistor T1 is connected to a gate of the second thin film transistor T2, a source of the second thin film transistor T2 is connected to power supply negative voltage VSS, and a drain of the second thin film transistor T2 is connected to a cathode of the first micro light emitting diode 31. In addition, the driving substrate 10 may further include a first capacitor C1. One end of the first capacitor C1 is connected to the drain of the first thin film transistor T1, and another end of the first capacitor C1 is connected to the source of the second thin film transistor T2.

The driving substrate 10 further includes a third thin film transistor T3 and a fourth thin film transistor T4. A gate of the third thin film transistor T3 is connected to a second scan signal S2, a source of the third thin film transistor T3 is connected to a second data signal M2, and a drain of the third thin film transistor T3 is connected to a gate of the fourth thin film transistor T4.

A source of the fourth thin film transistor T4 is connected to the power supply negative voltage VSS, and a drain of the fourth thin film transistor T4 is connected to a cathode of the second micro light emitting diode 32. In addition, the driving substrate 10 may further include a second capacitor C2, one end of the second capacitor C2 is connected to the drain of the third thin film transistor T3, and another end of the second capacitor C2 is connected to the source of the fourth thin film transistor T4.

An anode of the first micro light emitting diode 31 and an anode of the second micro light emitting diode 32 are both connected to a positive power supply voltage VDD.

The planarization layer 50 is disposed on a top of the display panel, and material of the planarization layer 50 may be an insulating material.

Because two micro light emitting diodes are disposed on a single display panel, and a reflective layer is disposed above the second micro light emitting diode, light of the second miniature light emitting diode is emitted toward a back surface of the display panel (i.e., a bottom of the display panel, a direction of an arrow is as illustrated in FIG. 1), and the light emitted by the first micro light emitting diode is directed to a front surface of the display panel, thus realizing double-sided display. Because two display panels are not required, an overall thickness of the display panel is reduced. In addition, production costs can be reduced.

An embodiment of the present disclosure also provides an electronic device, which includes the above display panel, and the electronic device can be a device such as a mobile phone or a tablet computer.

In the display panel and the electronic device of the embodiment of the present disclosure, because two micro light emitting diodes are disposed on a single display panel, and a first reflective layer is disposed above the second micro light emitting diode, light of the second micro light emitting diode is emitted toward a back surface of the display panel, thereby realizing a double-sided display, and because the two display panels are not required, an overall thickness of the display panel is reduced.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A display panel, comprising:
a driving substrate;
an insulating layer provided with a first receiving groove and a second receiving groove;
a first micro light emitting diode disposed in the first receiving groove;
a second micro light emitting diode disposed in the second receiving groove;
a first reflective layer disposed above the second micro light emitting diode and covering the second receiving groove;
a second reflective layer disposed on a sidewall of the second receiving groove; and
a third reflective layer disposed on a sidewall of the first receiving groove;
wherein the first reflective layer, the second reflective layer, and the third reflective layer are fabricated in a same process;
wherein the driving substrate further comprises a base substrate, and a projection area of the first reflective layer on the base substrate is greater than a projection area of the second receiving groove on the base substrate.

2. An electronic device comprising the display panel of claim 1.

3. A display panel, comprising:
a driving substrate;
an insulating layer provided with a first receiving groove and a second receiving groove;
a first micro light emitting diode disposed in the first receiving groove;
a second micro light emitting diode disposed in the second receiving groove; and
a first reflective layer disposed above the second micro light emitting diode;
wherein the driving substrate further comprises a base substrate, and a projection area of the first reflective layer on the base substrate is greater than a projection area of the second receiving groove on the base substrate.

4. The display panel according to claim 3, wherein the first reflective layer covers the second receiving groove.

5. The display panel according to claim 3, further comprising a second reflective layer disposed on a sidewall of the second receiving groove.

6. The display panel according to claim 5, further comprising a third reflective layer disposed on a sidewall of the first receiving groove.

7. The display panel according to claim 6, wherein the first reflective layer, the second reflective layer, and the third reflective layer are fabricated in a same process.

8. The display panel according to claim 3, wherein the first micro light emitting diode and the second micro light emitting diode are adjacent to each other.

9. The display panel according to claim 8, wherein the driving substrate comprises a pixel electrode, the pixel electrode covers the first micro light emitting diode and the second micro light emitting diode, and the first micro light emitting diode and the second micro light emitting diode are electrically connected to the pixel electrode.

10. The display panel according to claim 3, wherein the driving substrate further comprises a first thin film transistor and a second thin film transistor, a gate of the first thin film transistor is connected to a first scan signal, a source of the first thin film transistor is connected to a first data signal, a drain of the first thin film transistor is connected to a gate of the second thin film transistor, a source of the second thin film transistor is connected to a power supply negative voltage, and a drain of the second thin film transistor is connected to a cathode of the first micro light emitting diode.

11. The display panel according to claim 10, wherein the driving substrate further comprises a third thin film transistor and a fourth thin film transistor, a gate of the third thin film transistor is connected to a second scan signal, a source of the third thin film transistor is connected to a second data signal, a drain of the third thin film transistor is connected to a gate of the fourth thin film transistor, a source of the fourth thin film transistor is connected to the power supply negative voltage, and a drain of the fourth thin film transistor is connected to a cathode of the second micro light emitting diode.

* * * * *